United States Patent [19]
Nagata

[11] Patent Number: 5,532,604
[45] Date of Patent: Jul. 2, 1996

[54] DIELECTRIC CONSTANT MEASURING METHOD AND APPARATUS

[75] Inventor: Shinichi Nagata, Matsubara, Japan

[73] Assignee: New Oji Paper Co. Ltd., Tokyo, Japan

[21] Appl. No.: 297,619

[22] Filed: Aug. 29, 1994

[30] Foreign Application Priority Data

Aug. 31, 1993  [JP]  Japan ................... 5-216751

[51] Int. Cl.⁶ .............................................. G01N 22/00
[52] U.S. Cl. .................... 324/636; 324/631; 324/632
[58] Field of Search ......................... 324/629, 631, 324/633, 635, 636, 637, 639

[56] References Cited

U.S. PATENT DOCUMENTS

| | | | |
|---|---|---|---|
| 3,739,263 | 6/1973 | Henoch | 324/636 |
| 4,604,898 | 8/1986 | Gohin et al. | 324/636 |
| 4,710,700 | 12/1987 | Osaki et al. | 324/631 |
| 4,801,862 | 1/1989 | Osaki et al. | 324/631 |
| 4,904,928 | 2/1990 | Lewis | 324/636 |

*Primary Examiner*—Kenneth A. Wieder
*Assistant Examiner*—Diep Do
*Attorney, Agent, or Firm*—Morgan & Finnegan

[57] ABSTRACT

A method of measuring the dielectric constant of a sheet-like material is disclosed, the method using a cavity resonator having a transverse slit formed in the intermediate region thereof between the opposite ends for disposing a sample sheet perpendicularly to the direction of the length thereof. The dielectric constant is measured as a function of the difference $f_{1r}-f_{r2}$ between the microwave resonant frequency $f_{1r}$ of the cavity resonator obtained when the sample is not inserted in the transverse slit and the microwave resonant frequency $f_{r2}$ of the cavity resonator obtained when it is inserted in said transverse slit. The resonant frequency $f_{2r}(\beta)$ is calculated in the state in which the sample sheet in said transverse slit is rotated through a given angle $\beta$ with respect to said longitudinal axis from the predetermined angle designated by 0°, from the formula approximating the resonance curve in the cavity resonator.

10 Claims, 6 Drawing Sheets

DIELECTRIC CONSTANT MEASURING METHOD AND APPARATUS

BACKGROUND OF THE INVENTION

1. Field of the Invention

The present invention relates to a dielectric constant measuring apparatus, particularly to the sampling and processing of measured data and is intended to provide an apparatus which is easy to operate and efficient.

2. Prior Art

Conventionally, when it is desired to measure the dielectric constant of a material, this has heretofore been made by taking from a counter a resonant frequency which provides a peak output by scanning the frequency of measuring microwaves allowed to transmit the sample and calculating the dielectric constant from the difference between said resonant frequency and the resonant frequency which is present in the blank period when the smaple is not set. However, when it is desired to measure the orientation of the dielectric constant of a sample by this method, it is necessary to scan the microwave frequency for each of a plurality of measuring positions or angles, so as to detect the peak frequency position, and operation which requires much measuring time and much skill in measuring operation. Further, automatic processing for measurement has not been easy.

SUMMARY OF THE INVENTION

The present invention is intended to provide a dielectric constant measuring method which ensures simple and efficient measurement, and an apparatus for executing the method.

According to the present invention, a device includes a cavity resonator adapted to receive microwaves from one end thereof and detect the intensity of the microwaves at the other end, said resonator being formed with a slit for disposing a measurement sample sheet in such a manner as to cross a belly portion of standing waves formed in said cavity resonator, said sample sheet being made rotatable in the slit around the axis of the resonator, the dielectric constant being measured from the difference between the resonant frequency obtained when the sample is disposed at the measuring position in the slit and the resonant frequency obtained when it is not disposed. A dielectric constant measuring method according to the present invention is characterized in that in such device and through the intermediary of a resonant frequency at an arbitrary rotary angular position (reference angular position) of the sample which is disposed at the measuring position, a resonant frequency at another arbitrary rotary angular position (measuring angular position) of the sample is calculated, so as to find a device for measuring dielectric constants at arbitrary angles.

Further, according to the present invention, a dielectric constant measuring apparatus is composed of a mechanical structure and data processing means for automatically performing said method.

Further, according to the present invention, the device includes an arrangement for calculating a resonant frequency at an arbitrary measuring angular position of a sample from a resonant frequency (a first frequency) at the reference angular position and a second frequency which generates a microwave detection output of specific ratio predetermined with respect to the microwave detection output value during resonance in the reference angular position, and also from a microwave output with respect to the second frequency at said arbitrary measuring angular position of the sample; an arrangement for making the second frequency equal to a frequency which produces a microwave detection output value which is ½ of the microwave detection output value during resonance at the reference angular position of the sample; an arrangement provided with means for automatically setting the reference angular position of the sample by rotating the sample; an arrangement including means for rotating a measurement sample through a predetermined angle each time and means for sampling the microwave detection output value at the second frequency; and an arrangement having means for displaying the relation between the rotary angle and the dielectric constant of a sample in a two-dimensional pattern.

Suppose that the resonant curve is Lorentz's function, then it is expressed by the following formula (1) (See FIGS. 5 and 6):

where $f_{1r}$: blank resonant frequency.

$f_{2r}(\Theta)$: resonant frequency when a sample is set in the measuring position, which is a function of sample rotary angular position $\Theta$ where $\Theta=0$ is the reference angular position, and $\Theta=\beta$ is a state established by rotation through $\beta$ from the reference angle.

$I_0$: peak value of intensity of sample-transmitted microwaves (measured at frequency $f_{2r}(0)$)

f: measuring frequency $I\{f(\Theta)\}$ sample-transmitted microwave intensity detected at arbitrary angel ($\Theta$)

$$I\{f(\Theta)\}=I_0/[1+(\{f-f_{2r}(0)\}/H)^2] \quad (1)$$

wherein $H=f_1-f_{2r}(0)$ ($f_1$ is a frequency corresponding to half width (plus side) of $f_{2r}(0)$).

The reference curve when a sample is rotated around the axis of the resonator through an angle $\beta$ is, generally, $$I\{f(\beta)\}=I_0/[1+((f-f_{2r}(\beta))/H)^2]$$

putting the frequency $f=f_1$ then $$I\{f_1(\beta)\}=I_0/[1+(\{f_1-f_{2r}(\beta)\}/H)^2] \quad (2)$$

And put $H=f_1-f_{2r}(0)$.

From the formula (2), $$[\{f_1-f_{1r}(\beta)\}/H]^2=[I_0-I\{f_1(\beta)\}]/I\{f_1(\beta)\}\{f_1-f_{2r}(\beta)\}/H]=[I_0-I\{f_1(\beta)\}/I\{f_1(\beta)\}]^{1/2},$$

where $$\{F_1-f_{2r}(\beta)\}>0 f_{2r}(\beta)=f_1-H[[I_0-I\{f_1(\beta)\}]/I\ \{f_1(\beta)\}]^{1/2}, \quad (3)$$

Substituting this in the following formula (4) gives $\in'(\beta)$.

$$\in'(\beta)=1+A(C/t)\{f_{1r}-f_{2r}(\beta)\}/f_{1r} \quad (4)$$

Where A is a constant representing the cross sectional area of the cavity resonator, C is a constant representing the length thereof, and t is the thickness of the sample.

Plotting $\in'(\beta)$ found in this way for each angle ($\beta$) in a polar coordinate system gives a dielectric constant pattern as shown in FIG. 7.

If an ellipse approximating to this pattern is found by the method of least squares, then the direction of molecular orientation of the sample sheet can be found as the direction of the major axis of the ellipse.

Further, the value of the refractive index of the sample sheet is found to be $(\epsilon')^{1/2}$.

According to the above method, when it is desired to obtain an apparatus for measuring dielectric constant for each rotary angular position of a sample sheet by rotating around the axis of the resonator the sample sheet disposed perpendicular to the resonator, if data (such as resonant frequency $f_{2r}$ (0), half value width frequency $f_1$) on the resonance curve on the basis of a cetain angular position is obtained in advance, the resonant frequency can be found simply by obtaining data on transmitted microwave intensity at frequency $f_1$, without reading directly from the counter. Further, in connection with the premeasured and stored "blank" resonant frequency at the time when the sample is not set, the dielectric constants at the respective angular positions can be efficiently and simply obtained.

That is, through the intermediary of measured data at a certain angular position of the sample, the dielectric constants at a number of measuring angular positions can be found by very simple data sampling and calculations, thereby simplifying and accelerating the measurement and contributing to computer control of the measuring operation.

In additon, in the above description as the "measuring frequency", use has been made preferably of the half value width frequency $f_1$ relative to the resonant frequency at the reference angular position; however, $f_1$ on the low frequency side (See FIG. 5) may also be used.

DESCRIPTION OF THE PREFERRED EMBODIMENTS

Figure 1:
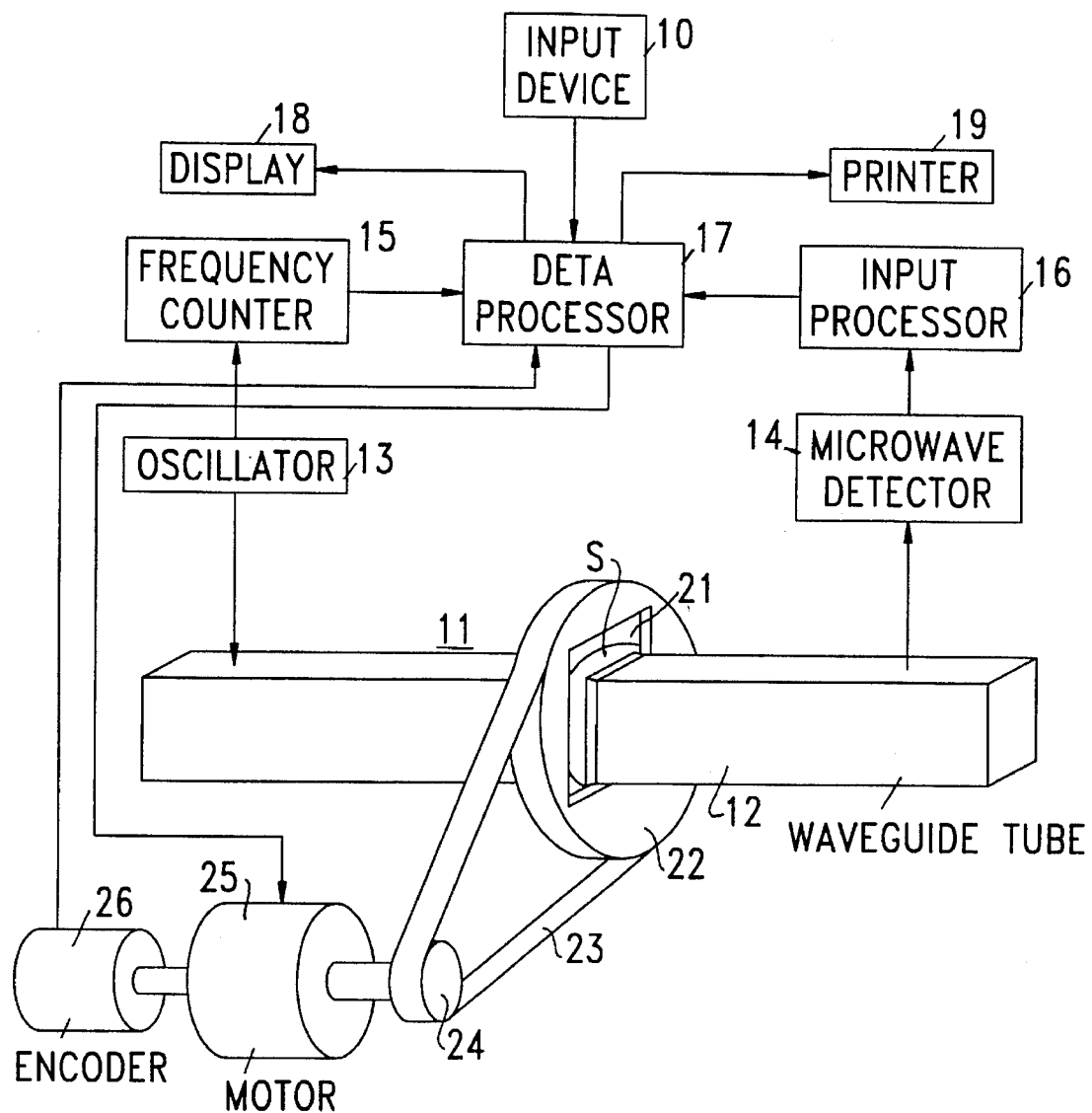
FIG. 1 is a diagrammatic structural view of a dielectric constant measuring apparatus according to the present invention.
Figure 2:
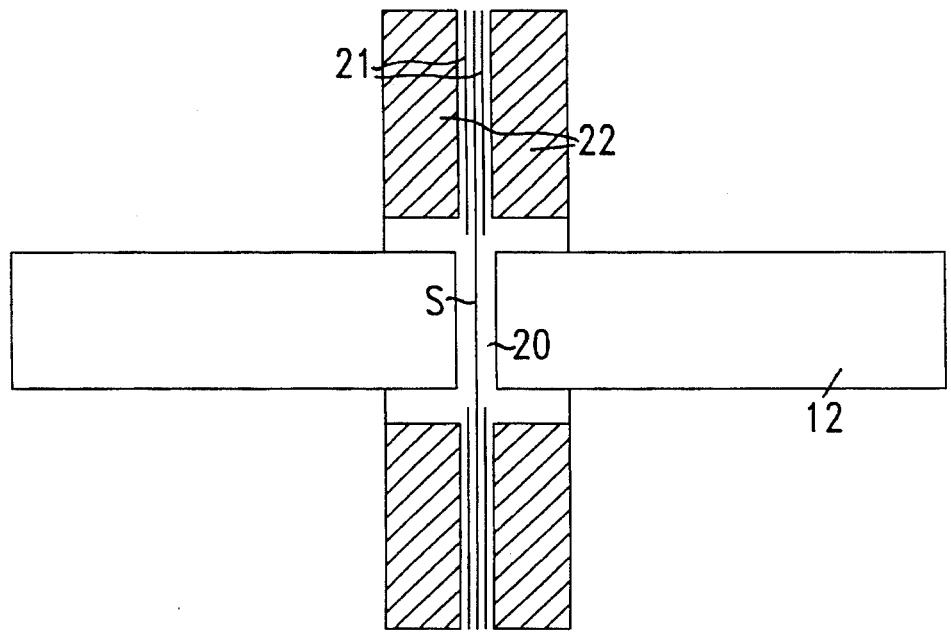
FIG. 2 is a view of an embodiment of the mechanism of FIG. 1 in the vicinity of a sample section.

FIG. 1 is a diagrammatic structural view of a dielectric constant measuring apparatus according to the present invention and FIG. 2 is a view showing in detail the region in the vicinity of a sample holding section.

In FIG. 1, the numeral 11 denotes a measuring instrument, wherein a sample sheet S clamped by a pair of sample holding plates 21 is inserted in a slit 20 (FIG. 3) formed in the middle of a microwave cavity resonator 12 in perpendicular relation to the axis of the resonator. The slit lies across a belly portion of standing wave formed in said resonator. Further, the sample is held so as to be rotatable around the longitudinal axis of the resonator by rotary holding disks 22 which hold the peripheral edges of the holding plates 19. This sample sheet S may be a macromolecular film, sheet or the like.

The numeral 13 denotes a microwave oscillator which feeds microwaves to one end of the resonator 12; 14 denotes a microwave detector, e.g., a microwave detector diode for detecting the intensity of an electric field at the other end in a particular direction, e.g., horizontal direction in the figure; and 15 denotes a frequency counter which detects the oscillating frequency of the oscillator 13. The numeral 16 denotes an input processing section which performs processing for introducing the detection output, i.e., the intensity of microwaves transmitted through the sample S in the resonator 12, into a data processing section 17.

The data processing section 17 includes an amplifier and A/D converter, and performs the sampling of data at preset angular positions.

The numeral 18 denotes a display device, used as a monitor, including a CRT or the like, for outputting the results of data processing; and 19 denotes a printer. Further, 10 denotes an input device, such as a key bard, used for setting a device operation mode and caluculation mode and for inputting sample information.

The sample sheet S, as shown in FIG. 2, is clamped between sample holding plates 21 made of plastic films and each having an opening with a diameter corresponding to the diagonal of the cross section of the resonator 12 and is held as an integral body by the rotary holding disks 22. The rotary holding disks 22 serve to hold the sample sheet S in the slit such that it is rotatable around the axis of the resonator 12. The rotary holding disks 22 are constructed in the form of a deformed doughnut-shaped belt pulley surrounding the resonator without contacting the latter and adapted to be driven by a motor 25 through a belt 23 and small pulley 24. A stepping motor is used as the motor 25 and each time it is rotated through 1°, an encoder 26 connected thereto produces an angle signal, which is sent to the input processing section 16 and data processing section 17.

Figure 3:
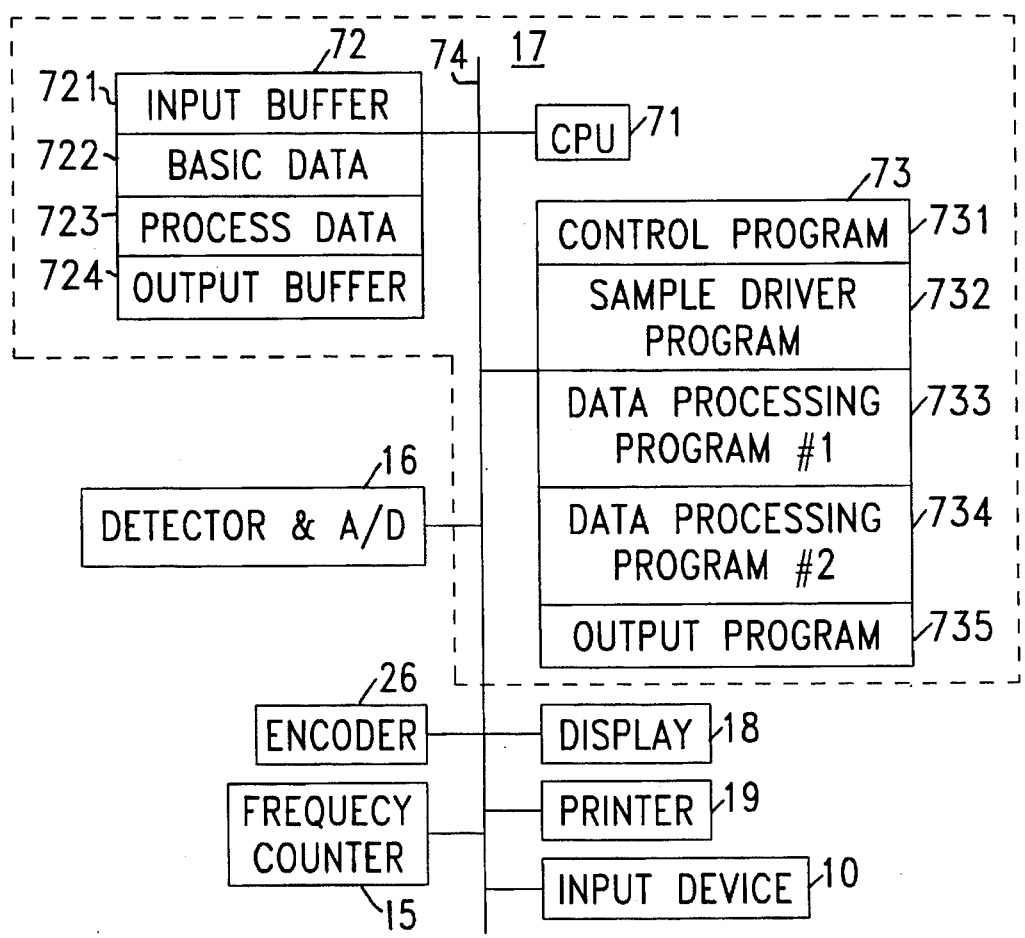
FIG. 3 is a system diagram of the dielectric constant measuring apparatus of the invention.

FIG. 3 is a system diagram of the dielectric constant measuring device of the invention, wherein the same elements as used in FIG. 1 are denoted by the same reference numerals.

In FIG. 2, the numeral 71 denotes a CPU; 72 denotes a data memory for storing measured data at each step and basic data; 73 denotes an arithmetic control section having stored therein a program for drive control of the apparatus and for various data processing operations; and 74 denotes a data bus line.

The data memory 72 is composed, e.g., of a RAM, and an input buffer 721 stores detected data (output from the input processing section 16) together with sample rotary angular position data from the encoder 26 and frequency data from the frequency counter 15. Constants and the like necessary for calculation, such as conditions for the cavity resonator, are stored in a basic data storing section 722. Process data at each step are stored in a process data storing section 723 and taken out to an output buffer 724 and displayed and/or printed out according to an output program 735.

A control program 731 perform control of the system as the entire device; a sample drive program controls the driving of the motor 25 according to the inputted measuring angle; a data processing program 1 (733) perform the sampling, storing and reading of data. A data processing program 2 (734) calculates the dielectric constant according to the formulas (3) and (4) and further calculates the degree of orienation and the orientation angle.

Figure 4A:
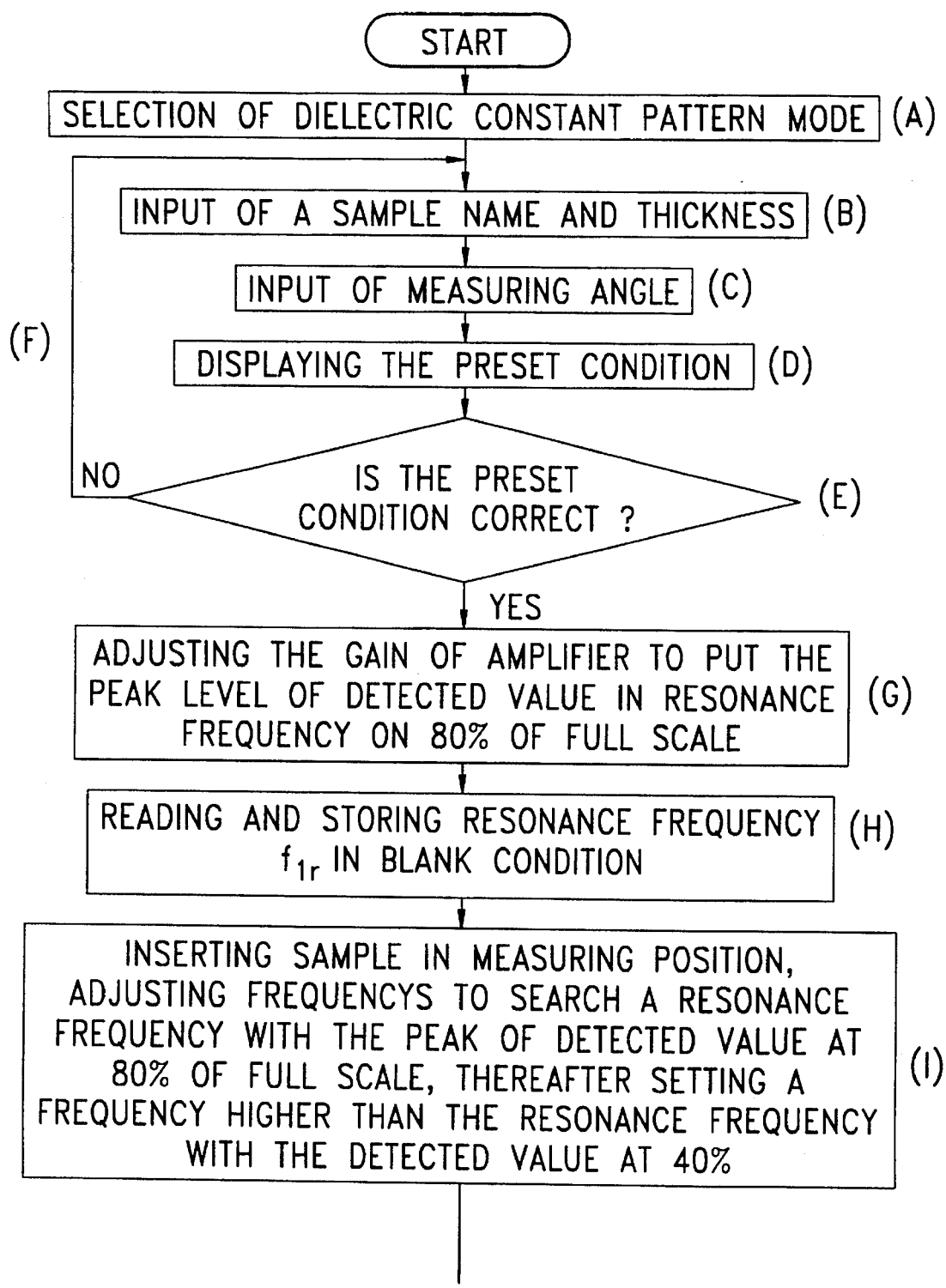
FIG. 4 is an example of flowchart of the operation of the invention.
Figure 4B:
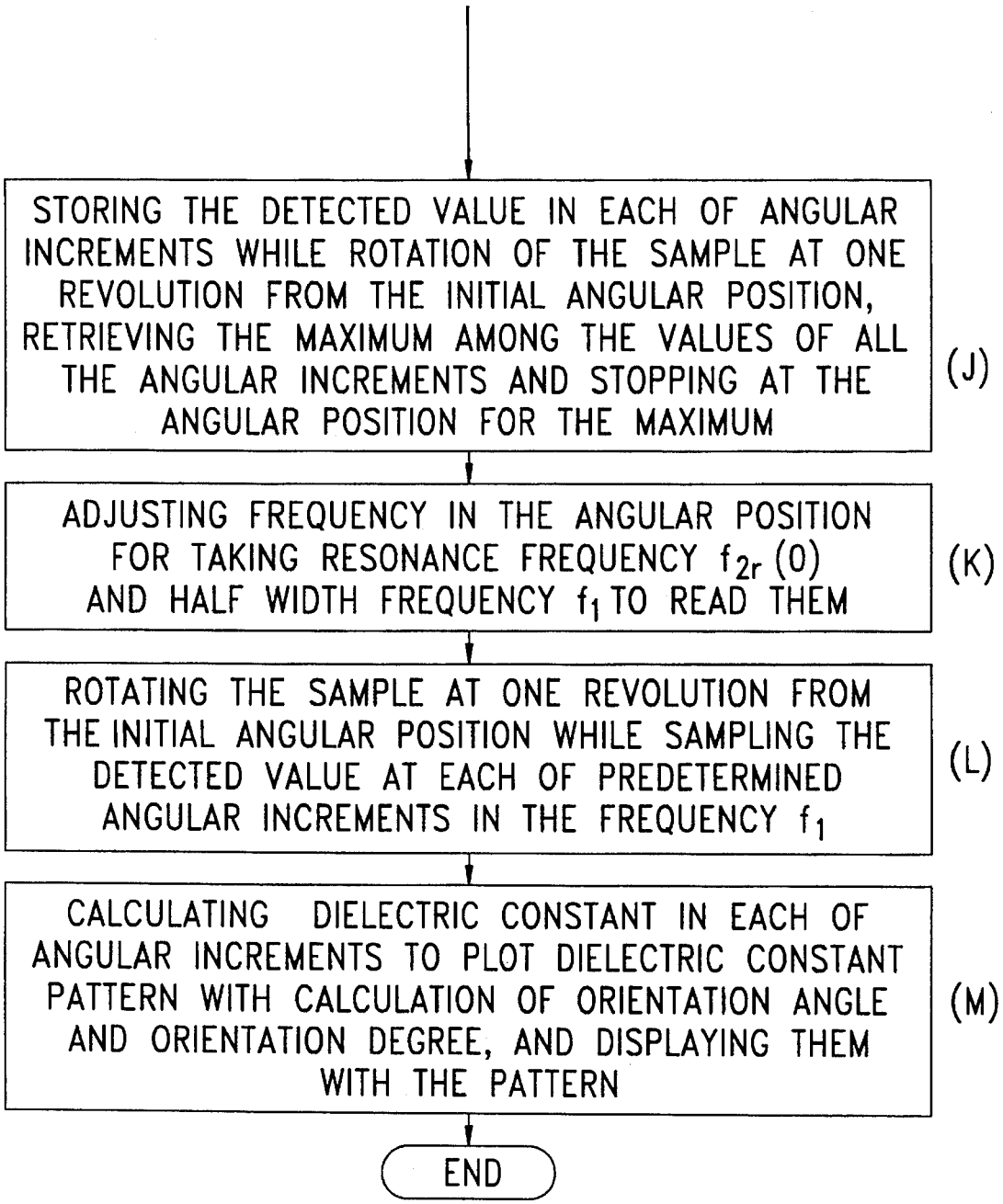
Figure 5:
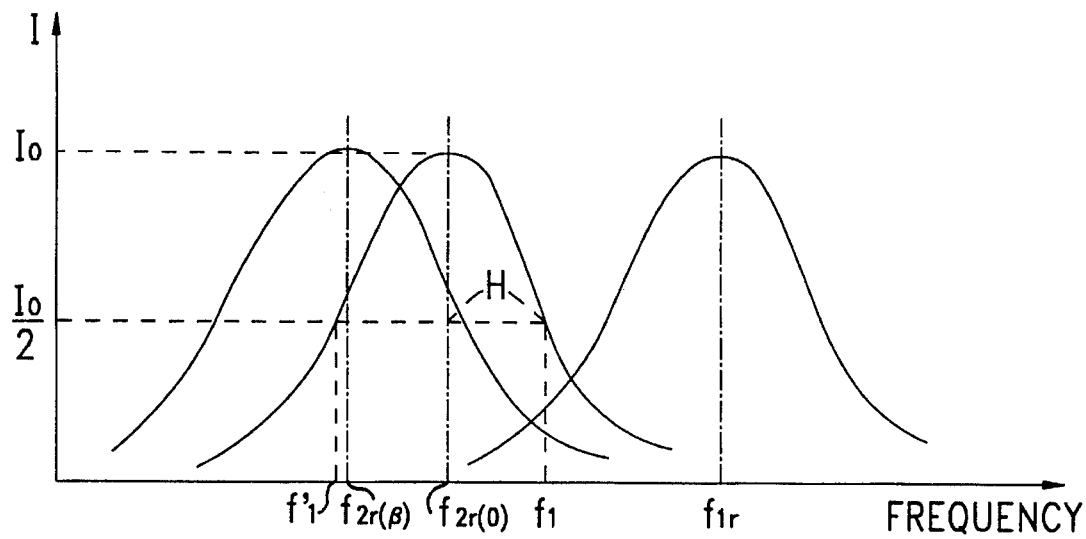
FIG. 5 is a view for explaining the operation of the present inventive apparatus.
Figure 6:
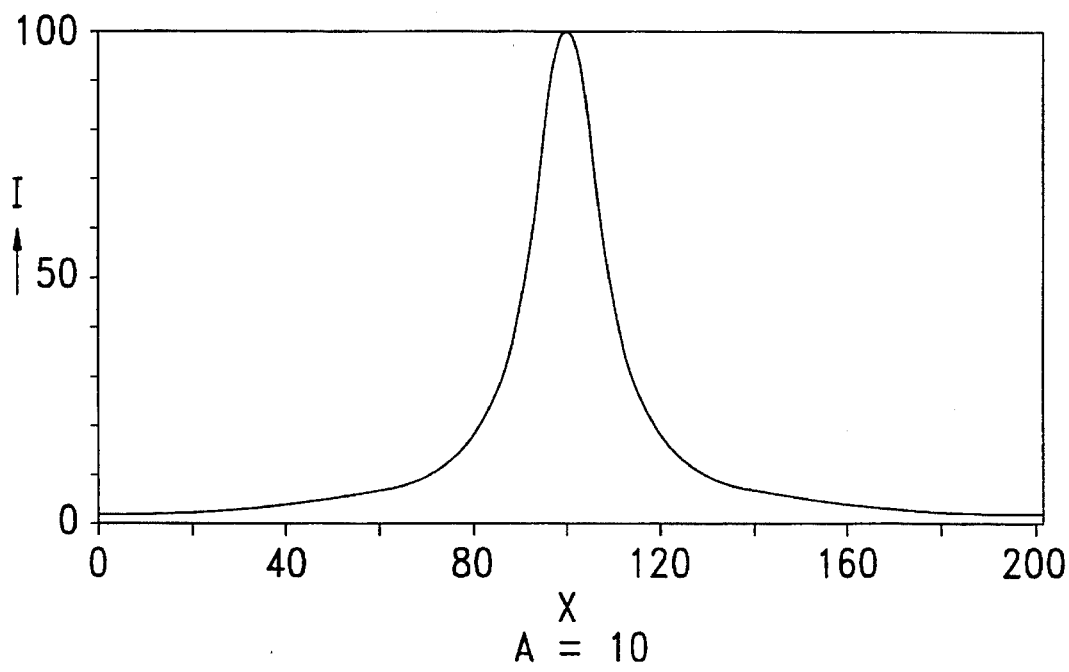
FIG. 6 is a view for explaining the operation of the present inventive apparatus.
Figure 7:
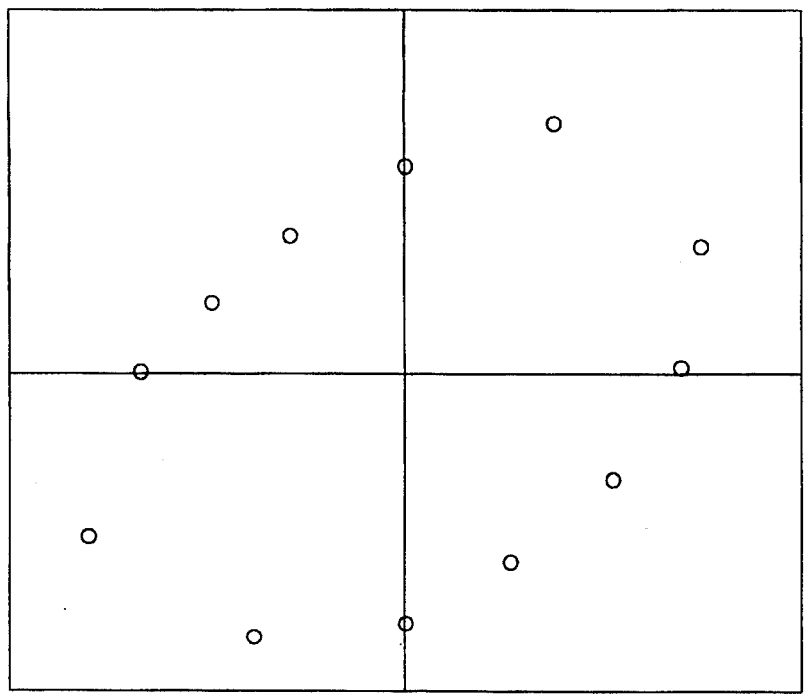
FIG. 7 is a graph showing an example of a dielectric constant pattern obtained by the present invention.

The dielectric constant measuring operation according to the present invention will now be described with reference to FIG. 4.

1. The operating mode of the device is set at the dielectric constant measuring mode (step A).

2. The sample name and thickness of the measurement sheet are inputted (sheet step B).

3. The measuring angle is inputted (step C).

4. The preset conditions which have been inputted are displayed and confirmed. If the preset conditions are not OK, they are reset. (Steps D, E, F, B and C).

5. If the preset conditions are OK, measurements are made, varying the microwave frequency with no sample being set, finding the frequency at which the detected value of the transmitted microwaves is peak while watching the meter, and adjusting the output from the microwave oscillator or the gain of the amplifier for detected output (step G). The resonant frequency $f_{1r}$ which has been read is stored (step H). In addition, preferably the device is constructed to automatically effect the reading of resonant frequency and the adjustment of peak level.

6. The sample S is inserted in the measuring position as shown in FIGS. 1 and 2 and the frequency of microwaves is changed to read and store the resonant frequency $f_{2r}$. After the gain and the like have been adjusted such that the peak value of resonance is 80% of the full scale, the frequency is adjusted to search a frequency (referred to as $f_1''$) on the high frequency side such that the detected value of transmitted microwave intensity is ½ of the peak value (step I).

7. The sample is rotated through one revolution at the frequency $f_1''$ and detected values are sampled during rotation for each preset angle, e.g., 1° and are stored in correspondence to the angle. The angular position at which the detected value of microwaves is at a maximum is searched and this angle is selected as the canonical reference angle, the rotation of the sample being stopped thereat (step J).

8. At this angular position, the microwave frequency is adjusted and the reference angle resonant frequency $f_{2r}(0)$ and the peak value $I_0$ of the microwave detection value are read and stored and, further, the frequency (half value width frequency) $f_1$ which produces a detected value of predetermined ratio, e.g., ½, with respect to the detected output during resonance is read and stored (step K). In addition, the step J may be omitted and instead the frquency $f_{2r}$ obtained in the step I is used as $f_2(0)$ and $f_1''$ as $f_1$ the program going to the next step.

9. At the microwave frequency $f_1$, the sample is rotated through one revolution from the initial angular position, during which rotation the detected output $I\{f_{2r}(\beta i)\}$ is sampled and stored for each rotation through the preset angle $\beta i$ (wherein i=1, 2, 3 ... ), e.g., 1° (step L).

10. Dielectric constants $\epsilon$ at respective angular positions are calculated (step M).

11. A dielectric constant pattern according to polar coordinates is prepared from the angle of rotation of the sample and the corresponding dielectric constant value. Further, the orientation angle and orientation degree can be calculated from this pattern. The results of these measurements will be displayed and printed out as the need arises.

12. The sample is exchanged and the above measurements are made using respective samples.

13. If the measuring mode is switched over to the microwave transmission degree measuring mode, it is possible to obtain a conventional microwave transmission degree pattern by using the detected output from the detector 14.

(EXAMPLES)

An actual measurement sample was rotated around the axis of the resonator and at various angles, the transmitted microwave intensity I was detected and the formulas (3) and (2) were used to calculate the resonant frequency $f_2$, dielectric constant $\epsilon'$, and refractive index n. Table 1 shows the results of measurements made for each 10° rotation of a sample (PET film), and Table 2 shows, for another sample which was circular, 360° rotation data taken at intervals of 30° by referring to the results of Table 1.

TABLE 1

| No | Angle (θ) | I (θ) | $f_2(θ)$ | ε | n |
|---|---|---|---|---|---|
| 1 | 0 | 600 | 3992.356 | 3.321 | 1.822 |
| 2 | 10 | 620 | 3992.471 | 3.319 | 1.822 |
| 3 | 20 | 650 | 3992.601 | 3.317 | 1.821 |
| 4 | 30 | 670 | 3991.684 | 3.314 | 1.820 |
| 6 | 40 | 680 | 3991.709 | 3.311 | 1.820 |
| 7 | 50 | 685 | 3991.715 | 3.310 | 1.819 |

TABLE 2

| No | Angle (θ) | I (θ) | $f_2(θ)$ | ε | n |
|---|---|---|---|---|---|
| 1 | 0 | 619 | 3981.320 | 3.072 | 1.753 |
| 2 | 30 | 513 | 3981.254 | 3.107 | 1.763 |
| 3 | 60 | 206 | 3980.879 | 3.30. | 1.817 |
| 4 | 90 | 116 | 3980.559 | 3.461 | 1.850 |
| 5 | 120 | 129 | 3980.633 | 3.428 | 1.852 |
| 6 | 150 | 272 | 3981.007 | 3.235 | 1.798 |
| 7 | 180 | 619 | 3981.320 | 3.072 | 1.753 |
| 8 | 210 | 515 | 3981.255 | 3.106 | 1.762 |
| 9 | 240 | 205 | 3980.879 | 3.301 | 1.817 |
| 10 | 270 | 117 | 3980.575 | 3.468 | 1.850 |
| 11 | 300 | 129 | 3980.633 | 3.428 | 1.852 |
| 12 | 330 | 270 | 3981.004 | 3.236 | 1.799 |

Table 3 shows the results of measurements from 0° to 180° at intervals of 30 degrees using 5 kinds of samples by the method of the present invention (new software), in comparison with the results obtained by the conventional measuring method (old software) which takes a peak frequency for each angle.

TABLE 3

| Sample No. | Angle | Prior art software | new software | difference |
|---|---|---|---|---|
| A (PET Film) | 0 | 3.544 | 3.541 | 0.013 |
| | 30 | 3.475 | 3.488 | −0.013 |
| | 60 | 3.527 | 3.523 | 0.004 |
| | 90 | 3.065 | 3.611 | −0.006 |
| | 120 | 3.67 | 3.663 | 0.007 |
| | 150 | 3.619 | 3.629 | −0.01 |
| B (PET Film) | 0 | 3.627 | 3.617 | 0.01 |
| | 30 | 3.592 | 3.609 | −0.017 |
| | 60 | 3.633 | 3.624 | 0.009 |
| | 90 | 3.658 | 3.647 | 0.011 |
| | 120 | 3.66 | 3.655 | 0.005 |
| | 150 | 3.628 | 3.639 | −0.011 |
| C (PET Film) | 0 | 3.308 | 3.318 | −0.01 |
| | 30 | 3.343 | 3.348 | −0.005 |
| | 60 | 3.328 | 3.33 | −0.002 |
| | 90 | 3.27 | 3.28 | −0.01 |
| | 120 | 3.248 | 3.248 | 0 |
| | 150 | 3.265 | 3.266 | −0.001 |
| D (PET Film) | 0 | 3.094 | 3.072 | 0.022 |
| | 30 | 3.113 | 3.107 | 0.006 |
| | 60 | 3.316 | 3.301 | 0.015 |
| | 90 | 3.487 | 3.461 | 0.026 |
| | 120 | 3.453 | 3.428 | 0.025 |
| | 150 | 3.266 | 3.235 | 0.031 |
| D (PTFE Film) | 0 | 2.072 | 2.085 | −0.013 |
| | 30 | 2.077 | 2.083 | −0.006 |
| | 60 | 2.072 | 2.079 | −0.007 |
| | 90 | 2.067 | 2.077 | −0.01 |

TABLE 3-continued

| Sample No. | Angle | Prior art software | new software | difference |
|---|---|---|---|---|
| | 120 | 2.057 | 2.079 | −0.022 |
| | 150 | 2.072 | 2.082 | −0.01 |

The mean value of the differences between the results of measurements of the two is 0.0010333, the maxim difference is 0.031 and the minimum difference is −0.022; these coincide very well.

Figure 8:
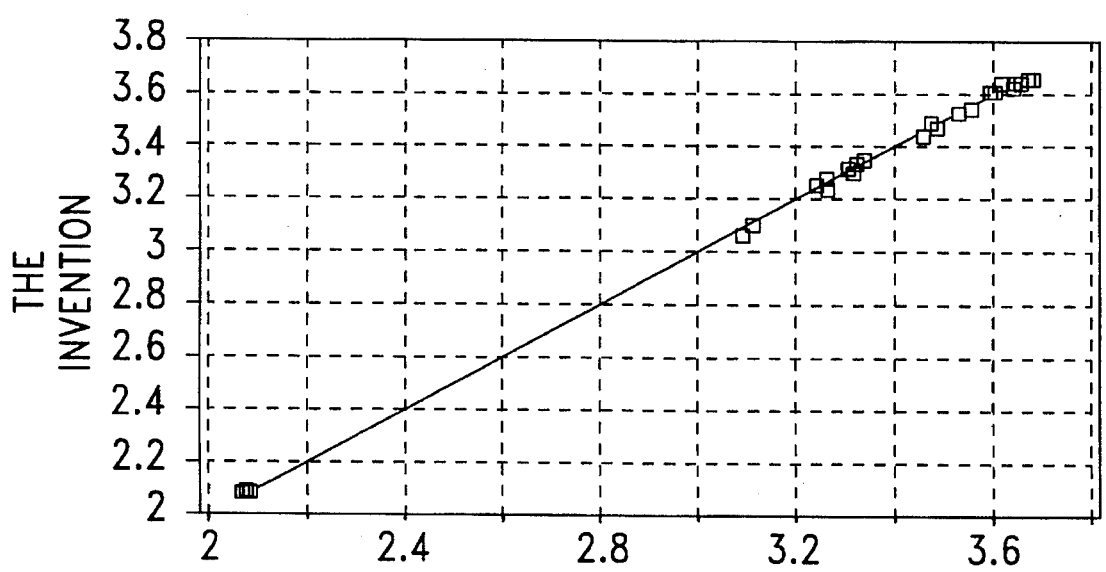
FIG. 8 is a graph showing an example of the results of measurements by the present inventive apparatus.

Further, FIG. 8 is a graph obtained by plotting the results of corresponding measurements using the new and old softwares, showing that the two coincide very well.

In the embodiment as described hereinabove, the resonant curve in the cavity resonator has been approximated with the Lorentz's function. However, any other functions, such as L-C-R resonance function, Gaussian distribution function can approximate the resonant curve within the scope of the invention.

According to the present invention, in finding the angle pattern by rotating a sample, a resonant frequency at an arbitrary measuring angular position is calculated through the intermediary of measured data (resonant frequency, half width value frequency, etc.) at a certain rotary angle, so as to find the dielectric constant; therefore, it is only necessary to sample transmitted microwave intensity detected values with a predetermined frequency in arbitrary measuring angular positions (it is unnecessary to read resonant frequency from the counter by changing the frequency, so that dielectric constants at a number of angular positions at intervals of, e.g., 1° revolutions can be measured simply and rapidly.) Thus, in contrast to the conventional system adapted to take the peak frequency from the counter, both the orientation pattern and the dielectric constant measurement pattern can be obtained by a simple device arrangement.

Further, since the sampling of data at the present measuring angular position is simple, computer control of measuring sequence is facilitated.

Further, according to the present invention, since the dielectric constant can be calculated by utilizing the detected output to find the microwave transmission degree pattern, the device arrangement is simplified.

What is claimed is:

1. A method of measuring a dielectric constant of a sheet-like material using a cavity resonator having two ends, one of which is adapted to receive microwaves and the other of which is adapted to detect the intensity of the microwaves, and said cavity resonator also having a transverse slit formed in the intermediate region between the two ends for disposing a sample consisting of the sheet-like material perpendicularly to the longitudinal axis of the cavity resonator extending therebetween, wherein the dielectric constant is calculated as a function of $f_{1r}-f_{2r}$, the difference between the microwave resonance frequency $f_{1r}$ of the cavity resonator obtained when the sample is not inserted in the transverse slit and the microwave resonance frequency $f_{2r}$ of the cavity resonator obtained when the sample is inserted in the transverse slit, said method comprising the steps of:

a) determining and storing the resonance frequency $f_{1r}$ when the sample is not inserted in the transverse slit;

b) determining and storing the resonance frequency $f_{2r}(0)$, the peak level $I_0$ of the sample-transmitted microwave energy in the frequency $f_{2r}(0)$ as a parameter in the resonance curve of the resonance frequency $f_{2r}(0)$, and at least one of the other parameters in the resonance curve of the resonance frequency $f_{2r}(0)$ providing the peak level $I_0$ of the sample-transmitted microwave energy for acquiring an approximated resonance curve to be selected from Lorentz's function, L-C-R resonance function and Gaussian distribution function or the like approximating the resonance curve of the sample by changing the frequency of the microwaves while the sample is inserted in the transverse slit and maintained at a predetermined angular position to be assumed as zero degrees in angle of rotation about the longitudinal axis of the cavity resonator;

c) determining and storing the sample-transmitted microwave energy level $I\{f(\beta)\}$ taken out of the cavity resonator by the frequency $f$ upon the sample in said transverse slit having been rotated through a certain angle $\beta$ about said longitudinal axis from said predetermined angular position;

d) calculating the resonance frequency $f_{2r}(\beta)$ at the angle $\beta$ of the sample in said transverse slit by approximating another resonance curve shifted in frequency by substituting the form-approximated resonance curve of the resonance frequency $f_{2r}(0)$ with the sample-transmitted microwave energy level $I\{f(\beta)\}$; and e) calculating the dielectric constant of the sample as a function of $f_{1r}-f_{2r}(\beta)$.

2. A method as set forth in claim 1, wherein the resonance curve to be selected is Lorentz's function and wherein the at least one of the other parameters is a half width frequency $f_1$ with respect to the resonance frequency $f_{2r}(0)$.

3. A method as set forth in claim 1, wherein the formula approximating the resonance curve at said angle $\beta$ of the sample is the equation of the Lorentz's function:

$$f_{2r}(\beta)=f_1-H[[(I_0-I\{f_1(\beta)\}]/I\{f_1(\beta)\}]^{1/2}$$

where $H=f_1-f_2(0)$ and $f_1$ is the half width frequency on the higher side of the resonance frequency $f_{2r}(0)$.

4. A method as set forth in claim 1, wherein said step of calculating the dielectric constant is made by the following equation:

$$\epsilon'(\beta)=1+A(c/t)\{f_{1r}-f_{2r}(\beta)\}/f_{1r}$$

where $\epsilon'(\beta)$ is the dielectric constant of the sample at angle $\beta$, A is a constant relating to the cavity resonator including the cross-sectional area of the cavity resonator, c is a constant representing the length of the cavity resonator, and t is the thickness of the sample.

5. A method as set forth in claim 1, wherein the predetermined angular position of the sample about the longitudinal axis of said cavity resonator is set at a rotary angle at which a maximum output is obtained with the same resonator input by rotating said sample after it is positioned at an arbitrary angular position in said transverse slit.

6. A method as set forth in claim 5, wherein the angle $\beta$ can be each of a plurality of angular positions $\beta_1, \beta_2 \ldots \beta_n$, which gradually increase by a predetermined pitch angle, and said calculation of the dielectric constant is made for each said pitch angle.

7. A apparatus for measuring the dielectric constant of a sheet-like material including a cavity resonator having two ends, one of which is adapted to receive microwaves and the other of which is adapted to detect the intensity of the microwaves, said cavity resonator also having a transverse slit formed in the intermediate region between the two ends for disposing a sample consisting of the sheet-like material, perpendicular to the longitudinal axis of the cavity resonator extending therebetween, wherein the dielectric constant is calculated as a function of $f_{1r}-f_{2r}$, the difference between the microwave resonance frequency $f_{1r}$ of the cavity resonator obtained when the sample is not inserted in the transverse slit and the microwave resonance frequency $f_{2r}$ of the cavity resonator obtained when the sample is inserted in the transverse slit, said apparatus comprising:

a) an oscillator capable of frequency scanning for supplying microwave energy from said one end to the cavity resonator;

b) a detector for detecting the intensity of the microwave energy taken out of said other end;

c) sample holding and rotating means capable of holding the peripheral edge of said sample, positioning the sample in said transverse slit of the cavity resonator and controllably rotating it around the longitudinal axis of said resonator;

d) data processing means adapted to receive frequency information from said oscillator and microwave intensity signals from said detector for storing and arithmetically processing the information and the signals;

wherein the angle of rotation of the sample about the longitudinal axis of said cavity resonator is defined as 0° in any predetermined angular position about said axis, and the dielectric constant of the sample at the angle β of rotation about said axis is calculated as a function of $f_{1r}-f_{2r}(\beta)$, where $f_{2r}(\beta)$ is calculated as the resonance frequency of the cavity resonator assuming that the sample has been maintained in the transverse slit of the cavity resonator at the angle β of rotation about said axis from the formula $$f_{2r}(\beta) = f_1 - H[|(I_0 - I\{f_1(\beta)\})/I\{f_1(\beta)\}|]^{1/2}$$

where $H = f_1 - f_{2r}(0)$, using a resonance frequency $f_{2r}(0)$ at the angle 0° of the sample in said transverse slit, the peak level $I_0$ of the sample-transmitted microwave intensity in the resonance frequency $f_{2r}(0)$ at the angle 0° of the sample whose half width frequency is $f_1$, the sample-transmitted microwave energy level $I\{f_1(\beta)\}$ by frequency $f_1$ at the angle β of the sample; and, (e) input means for inputting into said data processing means said angle β and constants or the like necessary to calculate the dielectric constant.

8. An apparatus as set forth in claim 8, wherein said sample holding means is to be controlled by said data processing means, said sample is to be automatically rotated after it has been positioned in said transverse slit at an arbitrary angular position, and the predetermined angular position (0°) of said sample with respect to the axis of said cavity resonator is set at an angular position where a maximum output is obtained for the same resonator input, said sample being automatically rotated through the measuring angular position (β) on the basis of said angular position (0°).

9. An apparatus as set forth in claim 8, wherein said measuring angular position (β) can be each of a plurality of angular positions β1, β2 . . . βn, which gradually increase by a predetermined pitch angle, and said calculation of the dielectric constant is made for each said pitch angle.

10. An apparatus as set forth in claim 9, wherein said apparatus further includes means for expressing the relation between the angular position of the sample and the dielectric constant in a two-dimensional pattern.

\* \* \* \* \*